(12) United States Patent
Fayrushin et al.

(10) Patent No.: US 12,279,434 B2
(45) Date of Patent: Apr. 15, 2025

(54) NAND STRUCTURES WITH POLARIZED MATERIALS

(71) Applicant: Micron Technology, Inc., Boise, ID (US)

(72) Inventors: Albert Fayrushin, Boise, ID (US); Kamal Karda, Boise, ID (US); Gianpietro Carnevale, Bottanuco (IT); Aurelio Giancarlo Mauri, Meda (IT)

(73) Assignee: Micron Technology, Inc., Boise, ID (US)

( * ) Notice: Subject to any disclaimer, the term of this patent is extended or adjusted under 35 U.S.C. 154(b) by 253 days.

(21) Appl. No.: 17/662,982

(22) Filed: May 11, 2022

(65) Prior Publication Data

US 2023/0371264 A1    Nov. 16, 2023

(51) Int. Cl.
*H10B 51/20* (2023.01)
*H10B 51/30* (2023.01)

(52) U.S. Cl.
CPC ............ *H10B 51/20* (2023.02); *H10B 51/30* (2023.02)

(58) Field of Classification Search
CPC ........ H10B 51/00; H10B 51/10; H10B 51/20; H10B 51/30
See application file for complete search history.

(56) References Cited

U.S. PATENT DOCUMENTS

| | | | |
|---|---|---|---|
| 2022/0059570 A1* | 2/2022 | Tanaka | H01L 29/7869 |
| 2023/0120089 A1* | 4/2023 | Yoon | H01L 29/516 |
| | | | 257/295 |
| 2023/0262986 A1* | 8/2023 | Lu | G11C 5/063 |
| | | | 257/295 |

FOREIGN PATENT DOCUMENTS

TW         202205623 A  *  2/2022   ........... H01L 23/535

* cited by examiner

*Primary Examiner* — Matthew E Warren
(74) *Attorney, Agent, or Firm* — Holland & Hart LLP (57) ABSTRACT

Methods, systems, and devices for NAND structures with polarized materials are described. A memory device may include a polarized dielectric material located relatively near to a channel, which may reduce interference between cells. The polarized dielectric material may include a dielectric material with a fixed polarity and having a first surface with a negative polarity oriented towards the channel. The negative polarity of the polarized dielectric material may affect an electron distribution of the channel by shifting the electron distribution closer to an associated charge trapping material. The shifted electron distribution may reduce an effect of an electric field of any aggressor cells of the memory device on one or more victim cells, by creating a more uniform channel electron distribution and increasing gate control relative to a channel without the effects of the polarized dielectric material.

12 Claims, 4 Drawing Sheets

NAND STRUCTURES WITH POLARIZED MATERIALS

FIELD OF TECHNOLOGY

The following relates to one or more systems for memory, including NAND structures with polarized materials.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

A memory device may include an array of memory cells to store data for a host device. The memory device may perform a programming (e.g., write) operation on the memory cells based on a command from the host device. For example, the memory device may drive a voltage through a channel (e.g., a channel material) associated with a set of memory cells to activate a target memory cell and perform the programming operation on the target cell, where the programming may include storing electrons (e.g., a charge) in a charge trapping material (e.g., an insulative material, a nitride-based material, such as a silicon nitride material) associated with the target memory cell (e.g., shared among the set of memory cells). In some cases, the stored charge may form one or more electric fields that may affect one or more nearby cells (e.g., victim cell(s)), such as by changing a threshold voltage of the one or more cells, which may result in increased latency, one or more errors, and/or decreased gate control (e.g., among other problems). In such cases, the cell with the stored charge may be referred to as an aggressor cell.

In accordance with examples disclosed herein, the memory device may include a polarized dielectric material located relatively near to the channel, which may reduce interference between cells. The polarized dielectric material may include a dielectric material with a fixed (e.g., embedded) polarity. For example, the polarized dielectric material may have a first surface with a negative polarity oriented towards the channel (e.g., where the polarized dielectric material may be located opposite the charge trapping material). The negative polarity of the polarized dielectric material may affect an electron distribution of the channel by shifting the electron distribution closer to the charge trapping material (e.g., associated with victim cell(s)). The shifted electron distribution may reduce an effect of the electric field of the aggressor cell on the one or more victim cells, for example, by creating a more uniform channel electron distribution and increasing gate control relative to a channel without the effects of the polarized dielectric material.

Figure 1:
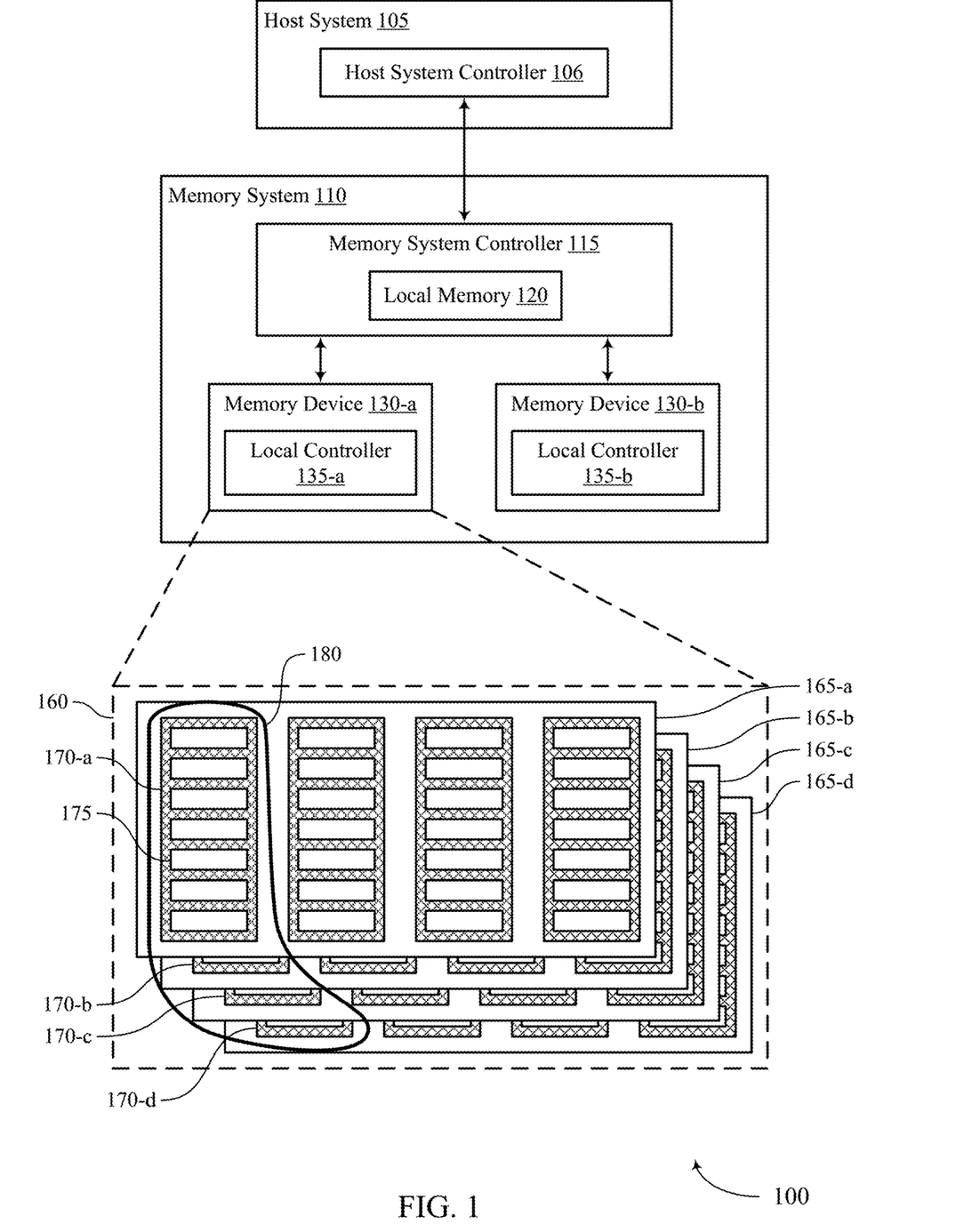
FIG. 1 illustrates an example of a system that supports NAND structures with polarized materials in accordance with examples as disclosed herein.
Figure 2:
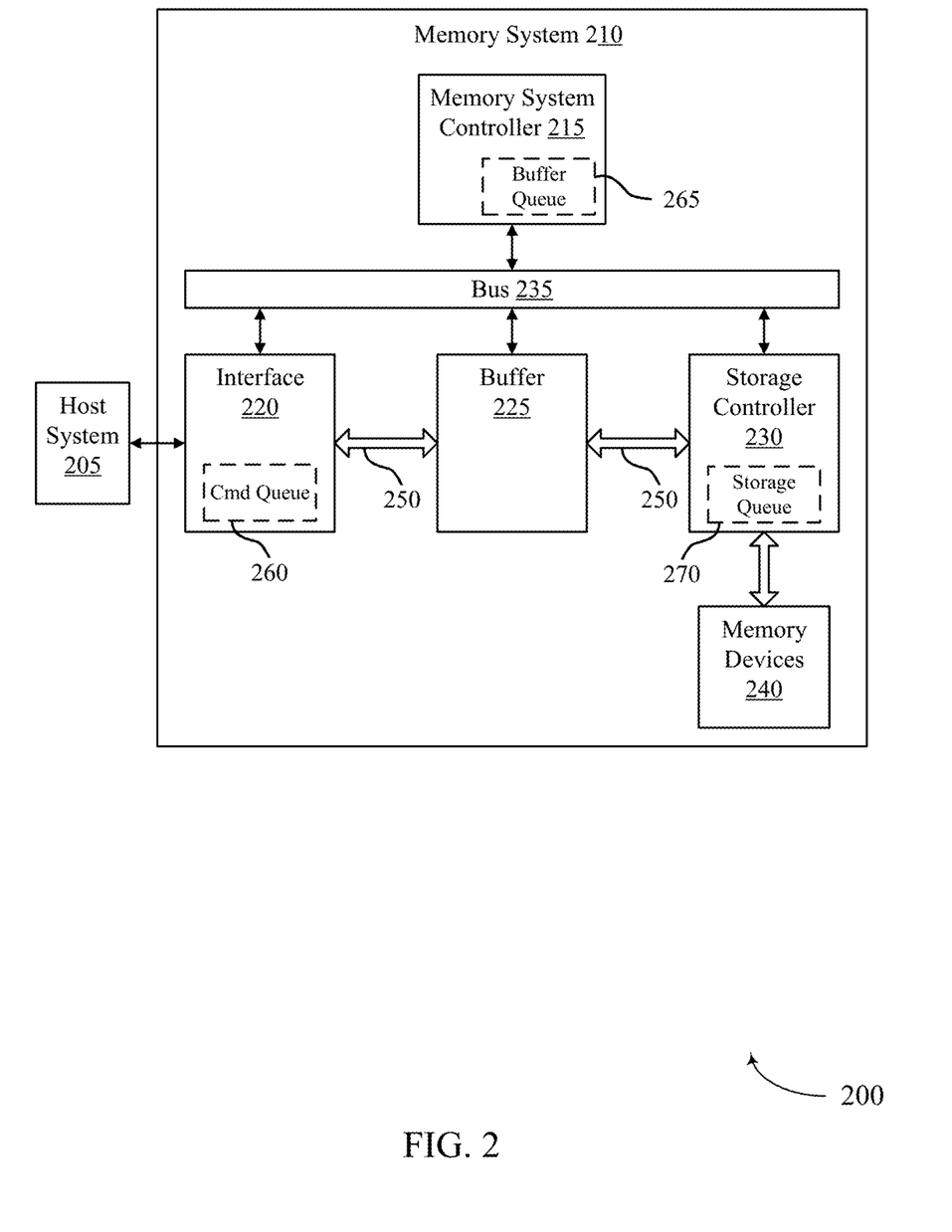
FIG. 2 illustrates an example of a system that supports NAND structures with polarized materials in accordance with examples as disclosed herein.

Features of the disclosure are initially described in the context of systems, devices, and circuits with reference to FIGS. 1 through 2. Features of the disclosure are described in the context of memory architectures with reference to FIGS. 3-4.

FIG. 1 illustrates an example of a system 100 that supports NAND structures with polarized materials in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

The system 100 may include any quantity of non-transitory computer readable media that support NAND structures with polarized materials. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

A memory device 130 may drive a voltage through a channel (e.g., a channel material) associated with one or more memory cells to activate a target memory cell and perform a programming operation on the target cell. Programming the target cell may include storing electrons (e.g., a charge) in a charge trapping material (e.g., an insulative material, a nitride-based material, such as a silicon nitride material) associated with the target memory cell (e.g., among other memory cells). In some cases, the stored charge may form one or more electric fields that may affect one or more nearby cells (e.g., victim cell(s)), such as by changing a threshold voltage of the one or more cells, which may result in increased latency, one or more voltage errors, and/or decreased gate control (e.g., among other problems). In such cases, the cell with the stored charge may be referred to as an aggressor cell.

In accordance with examples disclosed herein, the memory device 130 may include a polarized dielectric material located relatively near to the channel, which may reduce interference between cells. The polarized dielectric material may include a dielectric material with a fixed (e.g., embedded) polarity and having a first surface with a negative polarity oriented towards the channel (e.g., where the polarized dielectric material may be located opposite the charge trapping material). The negative polarity of the polarized dielectric material may affect an electron distribution of the channel by shifting the electron distribution closer to the charge trapping material. The shifted electron distribution may reduce an effect of the electric field of the aggressor cell on the one or more victim cells.

FIG. 2 illustrates an example of a system 200 that supports NAND structures with polarized materials in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In accordance with examples disclosed herein, a memory device 240 may include a polarized dielectric material located relatively near to a channel associated with a set of memory cells, which may reduce interference between cells. The polarized dielectric material may include a dielectric material with a fixed (e.g., embedded) polarity and having a first surface with a negative polarity oriented towards the channel. The negative polarity of the polarized dielectric material may affect an electron distribution of the channel by shifting the electron distribution closer to a charge trapping material (e.g., associated with the set of memory cell(s)).

Figure 3:
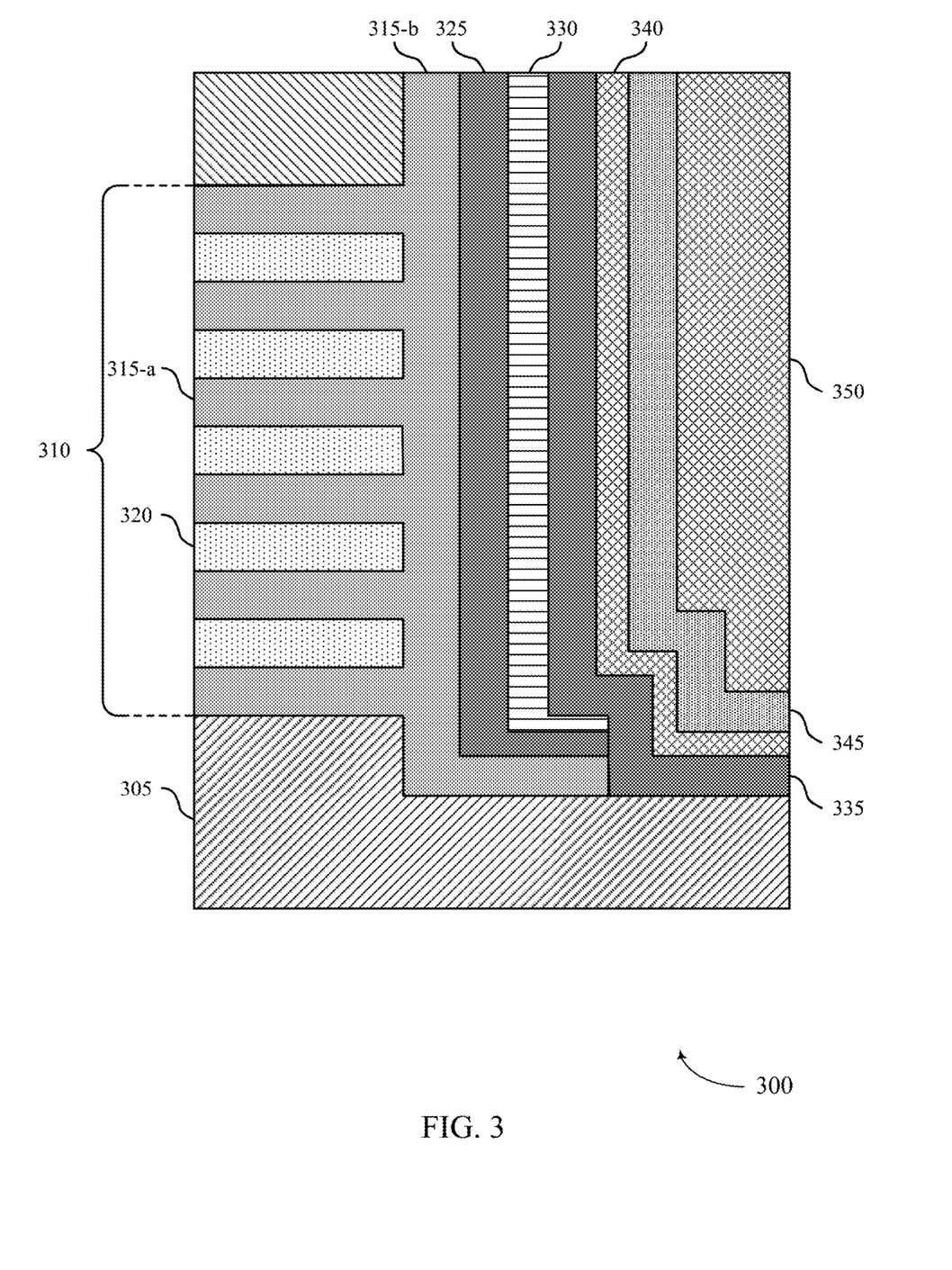
FIG. 3 illustrates an example of a memory architecture that supports NAND structures with polarized materials in accordance with examples as disclosed herein.

FIG. 3 illustrates an example of a memory architecture 300 implementing a polarized dielectric material 345 that supports NAND structures with polarized materials in accordance with examples as disclosed herein. The memory architecture 300 may be an example of a NAND structure (e.g., vertical NAND) as described with reference to FIGS. 1 and 2. For example, vertical NAND may represent a NAND structure in which NAND cells are arranged above one another, in a stack and where a memory device may include multiple stacks of NAND cells. The techniques and structures described herein may be used with a horizontal NAND structure in which NAND cells are arranged next to one another. In some cases, one or more cells arranged in a same stack may share some memory cell materials. The memory architecture 300 may implement aspects of the memory device 130 and 240 as described with reference to FIGS. 1 and 2.

The memory architecture 300 shows a cross-sectional view of an example architecture that may be implemented in the memory device 130 or 240. The memory architecture 300 may include a substrate 305 and a stack 310 of alternating materials formed on the substrate 305. The stack 310 of alternating materials may include layers of dielectric materials 315-a (e.g., a filler oxide) and conductive materials 320 (e.g., a NAND gate or gate line). In some cases, the conductive materials 320 may be associated with a set of memory cells, for example, such that each conductive material 320 may be associated with a respective memory cell. Any quantity of dielectric materials 315-a and conductive materials 320 may be layered based on a desired height of the vertical stack 310, or based on a quantity of the set of memory cells.

The memory architecture 300 may include a charge trapping material 325 (e.g., an insulator, a nitride-based material, such as a trapping nitride), a tunnel oxide material 330, a channel material 335 (e.g., a metal oxide semiconductor field-effect transistor (MOSFET) channel, a thin film channel, a polysilicon channel), a first oxide material 340, a polarized dielectric material 345, and a second oxide material 350 (e.g., a fill oxide). The charge trapping material 325, the tunnel oxide material 330, the channel material 335, the first oxide material 340, the polarized dielectric material 345, and the second oxide material 350 may be aligned with (e.g., coplanar to) the charge trapping material 325, which may extend in a different direction than the conductive materials 320 and dielectric materials 315-a (e.g., may be orthogonal to the conductive materials 320 and dielectric materials 315-a). For example, the charge trapping material 325, the tunnel oxide material 330, the channel material 335, the first oxide material 340, the polarized dielectric material 345, and the second oxide material 350 may extend away from the substrate 305 and along the stack 310 (e.g., through the stack 310).

In some cases, the charge trapping material 325, the tunnel oxide material 330, the channel material 335, the first oxide material 340, the polarized dielectric material 345, and the second oxide material 350 may be orthogonal to one or more materials of the alternating stack of materials (e.g., the conductive materials 320 and/or the dielectric materials 315-a). In some cases, a first surface of the charge trapping material 325 may be coincident to a dielectric material 315-b and a second surface may be coincident to the tunnel oxide material 330 (e.g., a first surface of the tunnel oxide material 330). In some examples, the first surface of the charge trapping material 325 may be coupled with the dielectric material 315-b and the second surface of the charge trapping material 325 may be in contact with the tunnel oxide material 330. In some examples, the first surface of the charge trapping material 325 may be in contact with the dielectric material 315-b and the second surface of the charge trapping material 325 may be coupled with the tunnel oxide material 330. In some cases, a first surface of the channel material 335 may be coincident to the tunnel oxide material 330 (e.g., a second surface of the tunnel oxide material 330) and a second surface may be coincident to the first oxide material 340, which may be between the channel material 335 and the polarized dielectric material 345. In some cases, the first oxide material 340 (e.g., or a portion thereof), the second oxide material 350 (e.g., or a portion thereof), or both, may represent an oxide liner of the polarized dielectric material 345. Additionally, the charge trapping material 325, the tunnel oxide material 330, the channel material 335, and the polarized dielectric material 345 may each be associated with the set of memory cells.

While the examples herein describe a NAND memory array structure (e.g., a vertical NAND structure, a gate-all around structure), such a structure is merely exemplary, and the same examples described herein may also apply to any planar, charge-trapping NAND memory cell (e.g., with a horizontal channel or a vertical channel).

In some cases, a programming operation may be performed to write a logic value to one or more memory cells in the memory architecture 300. In the programming operation, a voltage may be applied to the channel material 335 (e.g., among other portions of the memory architecture), which may result in storing electrons in the charge trapping material 325, respectively, for the one or more memory cells (e.g., which may be referred to as aggressor cells). In some examples, the electrons stored (e.g., trapped) in the charge trapping material 325 of an aggressor cell may form an electric field that may affect one or more victim cells (e.g., cell(s) above or below the aggressor cell). For example, the electric field associated with the electrons stored at the charge trapping material 325 may cause distortions of electrical fields in the horizontal and vertical directions (e.g., a superposition of electric fields in the horizontal and vertical directions). Such electric fields may cause a change in a threshold voltage at the one or more victim cells, which may be referred to as cell-to-cell (C2C) interference and may create a channel electron distribution around the aggressor cell and the neighboring memory cells (e.g., victim cells). In some examples, the electrons stored in a portion of the charge trapping material 325 associated with the aggressor cell may cause an electron distribution of the channel material 335 to shift away from a portion of the charge trapping material 325 associated with the victim cell(s).

In some cases, as a size of the memory architecture 300 decreases (e.g., due to pitch scaling), a space between cells (e.g., aggressor and victim cells) may also decrease, such that electrons stored at the charge trapping material 325 of an aggressor cell may be more likely to adversely affect the victim cells (e.g., as the space between the aggressor cell and the victim cell decreases). For example, the electric field produced from the electrons stored at the charge trapping material 325 of the aggressor cell may affect a threshold voltage extracted from a victim cell (e.g., a weakly programmed victim cell), causing C2C interference. In some implementations, the victim cell may experience voltage errors and/or decreased gate control based on the C2C interference. For example, variations in properties of the channel material 335 (e.g., electron distribution of the channel material 335) may be based on a location of electrons in the channel material 335 while a threshold voltage of a cell (e.g., victim cell) is measured. In such examples, shifting the electron distribution of the channel material 335 away from the victim cells (e.g., the charge trapping material 325 and/or the stack 310) may cause latency when performing access operations, due to the misalignment of electrons in the channel material 335.

In accordance with examples disclosed herein, the memory architecture 300 may include the polarized dielectric material 345, which may be located near the channel material 335 (e.g., opposite from the charge trapping material 325), and which may have one or more effects on the channel material 335 to reduce C2C interference. In some cases, the polarized dielectric material 345 may include a dielectric material (e.g., an aluminum nitride (AlN) film) with a fixed polarity (e.g., embedded polarization vector). The polarized dielectric material 345 may be process-controlled to be directionally charged to influence the behavior of nearby electrons. In some implementations, the polarized dielectric material 345 may be deposited to the memory architecture 300 after formation of the channel material 335, thereby retaining the polarity properties of the polarized dielectric material 345 in the face of temperature effects associated with operation and manufacturing (e.g., the polarity of the polarized dielectric material 345 may not be affected by relatively high temperatures).

The polarized dielectric material 345 may have a negative polarity oriented towards the channel material 335 (e.g., may have a first surface oriented towards the channel material 335, which may have a negative polarity). The negative polarity of the polarized dielectric material 345 may affect the channel electron distribution by facilitating electrons in the channel material 335 closer to the charge trapping material 325 associated with victim cells. For example, the polarized dielectric material 345 may create a negative charge in the first oxide material 340 (e.g., a dielectric material), near an interface with the channel material 335 (e.g., a back channel interface). The negative charge may push electrons in the channel material 335 towards the other side of the channel material 335 (e.g., to an interface with the tunnel oxide material 330, closer to the charge trapping material 325), which may increase gate control for the victim cell(s) and reduce C2C interference. In some cases, the polarized dielectric material 345 may have a positive polarity oriented towards the channel material 335 (e.g., may have a first surface oriented towards the channel material 335, which may have a positive polarity).

In some cases, shifting electrons within the channel material 335 closer to the victim cell(s) (e.g., closer to the charge trapping material 325) may reduce an effect on victim cell threshold voltage(s) from the electric field of the electrons stored at the charge trapping material 325 associated with the aggressor cell(s). In such cases, the polarized dielectric material 345 may decrease C2C interference and increase gate control by creating a more uniform electron distribution in the channel material 335, for example, relative to the channel material 335 without the effects of the polarized dielectric material 345. For example, shifting electrons in the channel material 335 closer to the charge trapping material 325 (e.g., and tunnel oxide material 330) may increase victim cell immunity to aggressor cell charging.

Figure 4:
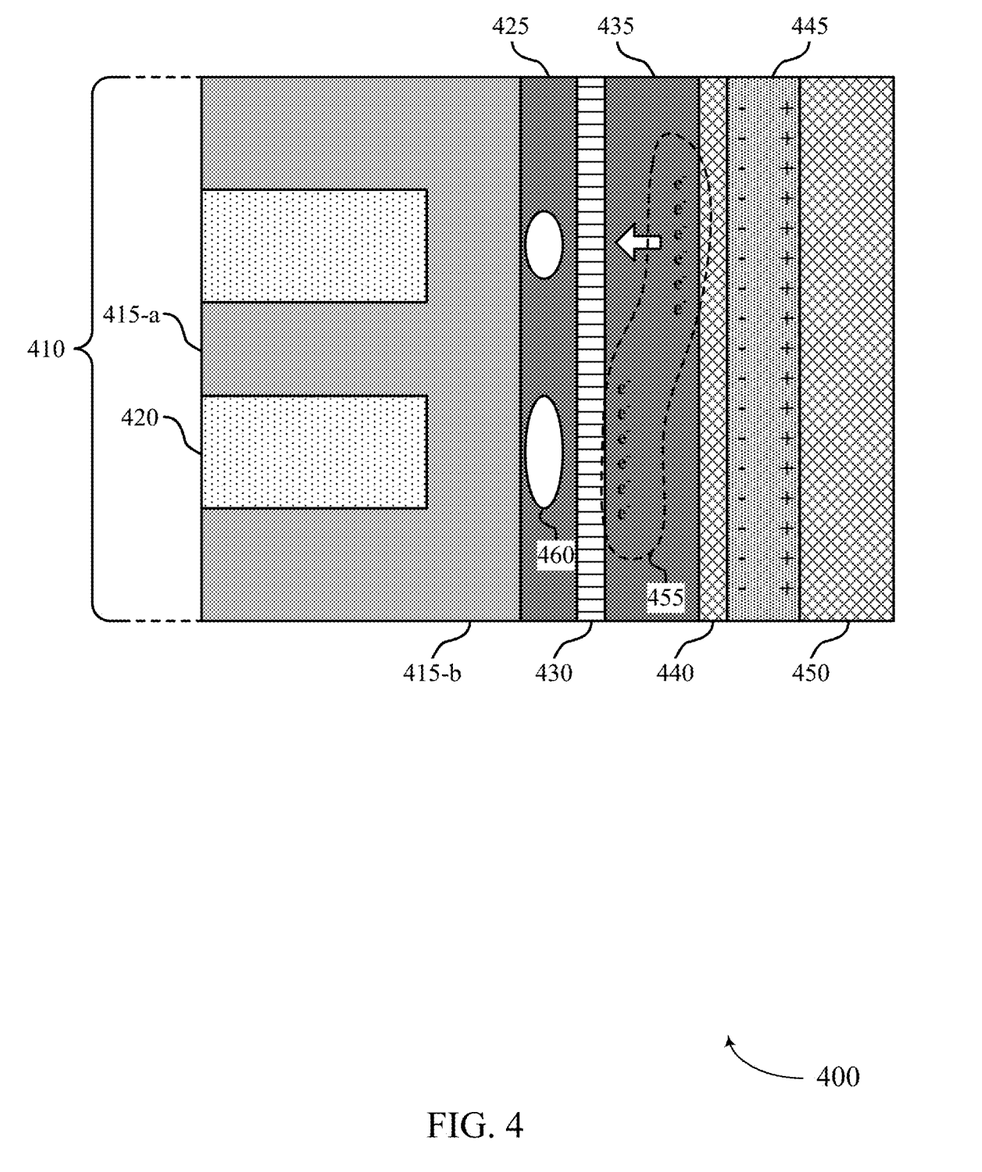
FIG. 4 illustrates an example of a memory architecture that supports NAND structures with polarized materials in accordance with examples as disclosed herein.

FIG. 4 illustrates an example of a memory architecture 400 implementing a polarized dielectric material 445 that supports NAND structures with polarized materials in accordance with examples as disclosed herein. The memory architecture 400 may be an example of the memory architecture 300 (e.g., a portion thereof) as described with reference to FIG. 3. The memory architecture 400 may implement one or more aspects of the memory device 130 and 240 as described with reference to FIGS. 1 and 2. Similarly, memory architecture 400 may include one or more materials similar to the charge trapping material 325, the tunnel oxide material 330, the channel material 335, the first oxide material 340, the polarized dielectric material 345, and the second oxide material 350, as described with reference to FIG. 3.

The memory architecture 400 shows a cross-sectional view of an example architecture that may be implemented in the memory device 130 or 240. The memory architecture 400 may include a substrate and a stack 410 of alternating materials formed on the substrate. The stack 410 of alternating materials may include layers of dielectric materials 415-*a* (e.g., a filler oxide) and conductive materials 420 (e.g., a NAND gate or gate line). In some cases, the conductive materials 420 may be associated with a set of memory cells, for example, such that each conductive material 420 may be associated with a respective memory cell. Any quantity of dielectric materials 415-*a* and conductive materials 420 may be layered based on a desired height of the vertical stack 410, or based on a quantity of the set of memory cells.

A dielectric material 415-b may be included in the memory architecture 400, and may extend in a different direction than (e.g., orthogonal to) materials of the alternating stack 410. The dielectric material 415-a may form a dielectric material barrier around layers of dielectric material 415-a and conductive material 420. In some cases, a charge trapping material 425 may be deposited onto the dielectric material 415-b, a tunnel oxide material 430 may be deposited onto the charge trapping material 425, a channel material 435 may be deposited onto the tunnel oxide material 430, a first oxide material 440 (e.g., an oxide liner) may be deposited onto the channel material 435, a polarized dielectric material 445 may be deposited onto the first oxide material 440, and a second oxide material 450 (e.g., filler oxide) may be deposited onto the polarized dielectric material 445.

The memory architecture 400 may include a charge trapping material 425 (e.g., a nitride-based material, such as a trapping nitride), a tunnel oxide material 430, a channel material 435 (e.g., a MOSFET channel, a thin film channel, a polysilicon channel), a first oxide material 440 (e.g., an oxide liner), a polarized dielectric material 445, and a second oxide material 450 (e.g., fill oxide). The charge trapping material 425, the tunnel oxide material 430, the channel material 435, the first oxide material 440, the polarized dielectric material 445, and the second oxide material 450 may be aligned with (e.g., coplanar to) the charge trapping material 425, and may be positioned along the stack 410 (e.g., extend through the stack 410). In some cases, the charge trapping material 425, the tunnel oxide material 430, the channel material 435, the first oxide material 440, the polarized dielectric material 445, and the second oxide material 450 may extend in a different direction than (e.g., be orthogonal to) one or more materials of the alternating stack of materials (e.g., the conductive materials 420 and/or the dielectric materials 415-a).

In some cases, a first surface of the charge trapping material 425 may be coincident to the dielectric material 415-b and a second surface may be coincident to the tunnel oxide material 430 (e.g., a first surface of the tunnel oxide material 430). In some cases, a first surface of the channel material 435 may be coincident to the tunnel oxide material 430 (e.g., a second surface of the tunnel oxide material 430) and a second surface may be coincident to the first oxide material 440, which may be between the channel material 435 and the polarized dielectric material 445. In some cases, the first oxide material 440 (e.g., or a portion thereof), the second oxide material 450 (e.g., or a portion thereof), or both, may represent an oxide liner of the polarized dielectric material 445. Additionally, the charge trapping material 425, the tunnel oxide material 430, the channel material 435, and the polarized dielectric material 445 may each be associated with the set of memory cells. The charge trapping material 425 may, in some cases, be programmed to store a charge 460 associated with a memory cell (e.g., aggressor cell) of the set of memory cells. An electron distribution 455 of the channel material 435 (e.g., shown as "e⁻") may be associated with operation of the set of memory cells (e.g., and the charge trapping material 425), for example, as described with reference to FIG. 3.

The memory architecture 400 may include the polarized dielectric material 445, which may reduce C2C interference, as described with reference to FIG. 3. The polarized dielectric material 445 may, for example, affect the electron distribution 455 of the channel material 435, such as by shifting electrons in the channel material 435 closer to the tunnel oxide material 430 and the charge trapping material 425 (e.g., a portion of the charge trapping material 425 associated with one or more victim cells). In some cases, shifting the electron distribution 455 towards the tunnel oxide material 430 and the charge trapping material 425 (e.g., of the victim cell(s)) may be based on a design of the memory architecture 400. For example, the channel material 435 may be positioned between the charge trapping material 425 and the polarized dielectric material 445 (e.g., also between the tunnel oxide material 430 and the polarized dielectric material 445). In such examples, shifting the electron distribution 455 may be based on the positioning of the channel material 435, the tunnel oxide material 430, the charge trapping material 425, the polarized dielectric material 445, or any combination thereof.

Similarly, the electron distribution 455 may also be based on a design and polarity (e.g., an orientation of the polarity) of the polarized dielectric material 445. The polarized dielectric material 445, for example, may have a fixed polarity and may include or represent a type of material which may acquire stable, directed polarization after deposition as a film of a certain thickness (e.g., with a thickness of one or more nanometers (nm)). For example, the polarity of the polarized dielectric material 445 (e.g., a direction of polarization vector of the polarized dielectric material 445) may be process controlled.

A polarity of the polarized dielectric material 445 may, for example, be based on a charge of an atom (e.g., layer of atoms) initially deposited to a substrate of the polarized dielectric material 445 during formation. For example, if the charge of an initial atom (e.g., layer of atoms) deposited for the polarized dielectric material 445 is negative, then the polarity of the polarized dielectric material 445 may be negative in that orientation or direction. In some cases, the polarized dielectric material 445 may have a first, positively charged surface (e.g., shown with the "+" symbol in FIG. 4) oriented away from the channel material 435 and a second, negatively charged surface (e.g., shown with the "−" symbol in FIG. 4) oriented towards the channel material 435, which may be referred to as a negative polarity of the polarized dielectric material 445. The orientation of the charge of the first surface and the second surface may support the electron shifting in the channel material 335 as described herein.

In some cases, the polarized dielectric material 445 may be a wide band semiconductor (e.g., an AlN material) with a constant polarization that is thermally stable over a range of temperatures (e.g., thermally stable over operating temperatures of an associated memory device, such as up to 1000 Kelvin (K), compatible with a NAND flash process). A band gap of the wide band semiconductor material (e.g., of the polarized dielectric material) may be relatively wide, which may support a higher barrier to electron movement.

As described herein, the addition of the polarized dielectric material 445 to the memory architecture 400 may reduce C2C interference. For example, C2C interference may be represented (e.g., measured) by a change in a victim cell's threshold voltage divided by a change in an aggressor cell's threshold voltage. A polarized dielectric material 445 with a negative polarity (e.g., a negative charge oriented towards the channel material 435) may reduce C2C interference as measured by the change in the victim cell's threshold voltage divided by the change in the aggressor cell's threshold voltage, with larger-magnitude negative charges associated with a higher reduction in C2C interference.

A negative-polarity polarized dielectric material 445 may also result in a reduction in cell programming time, for example, compared to an absence of a polarized dielectric material 445. Conversely, a negative-polarity polarized dielectric material 445 may result in relatively small increased cell erase time. However, because of the reduction in C2C interference, the polarized dielectric material 445 may support a reduction in space between memory cells (e.g., associated with scaling the memory architecture 400), which may result in an overall decrease in erase time (e.g., across multiple memory cells), compared with a traditional memory architecture. Similarly, the presence of the polarized dielectric material 445 in the memory architecture 400 may have no effect, or a relatively small effect, on a rate of change of a bit line current for accessing (e.g., reading, writing) memory cells (e.g., multi-level cells).

In some implementations, one or both surfaces of the polarized dielectric material 445 (e.g., one or both of the negatively charged surface and the positively charged surface) may be lined with an oxide liner (e.g., oxide material 440 and/or 450, or a portion thereof). For example, the first, positively charged surface may be lined with the second oxide material 450 (e.g., or a portion thereof may represent or include an oxide liner) and the second, negatively charged surface may additionally or alternatively be lined with the first oxide material 440 (e.g., or a portion thereof may represent or include an oxide liner). In some implementations, the first oxide material 440 and the second oxide material 450 may be a same material (e.g., or similar material). Because the polarity of the polarized dielectric material 445 may be based on a polarity of an atom (e.g., layer of atoms) initially deposited, an oxide liner may support deposition of a correct polarity.

For example, an oxide liner (e.g., the second oxide material 450) lining the first surface of the polarized dielectric material 445 may have a positive charge and may support formation of the positive charge of the first, positively charged surface (e.g., the oxide liner acting as a substrate for formation of the polarized dielectric material 445). Additionally or alternatively, an oxide liner (e.g., the first oxide material 440) lining the second surface of the polarized dielectric material may have a negative charge and may support formation of the negative charge of the second, negatively charged surface (e.g., the oxide liner acting as a substrate for formation of the polarized dielectric material 445). In some cases, the oxide liner may be deposited before formation of the polarized dielectric material 445, and the polarized dielectric material 445 may be deposited on the oxide liner (e.g., with the specified orientation of polarity). For example, in the case of a negative oxide liner, the negative oxide liner may be deposited (e.g., on the channel material 435) after formation of the channel material 435, and the polarized dielectric material 445 may be deposited on the negative oxide liner (e.g., after which a fill oxide, such as the second oxide material 450 may be deposited). In some cases, a positive oxide liner may be deposited after formation of the polarized dielectric material 445. In some other cases, a positive oxide liner may be deposited (e.g., on the filler oxide) before formation of the polarized dielectric material 445, and the polarized dielectric material 445 may be deposited on the positive oxide liner.

It should be noted that the described techniques include possible implementations, and that the components, the operations, and the steps may be rearranged or otherwise modified and that other implementations are possible.

An apparatus is described. The following provides an overview of aspects of the apparatus as described herein:

Aspect 1: An apparatus, including: a substrate; an alternating stack of materials positioned on the substrate, the alternating stack of materials including conductive materials and dielectric materials; a charge trapping material extending away from the substrate and through the alternating stack of materials, the charge trapping material associated with a plurality of memory cells; a channel material extending away from the substrate and through the alternating stack of materials, the channel material associated with the plurality of memory cells; and a polarized dielectric material extending away from the substrate and through the alternating stack of materials, the polarized dielectric material configured to shift an electron distribution of the channel material towards the charge trapping material.

Aspect 2: The apparatus of aspect 1, where the channel material is positioned between the charge trapping material and the polarized dielectric material, and the shifted electron distribution of the channel material is based at least in part on the positioning of the charge trapping material, the channel material, and the polarized dielectric material.

Aspect 3: The apparatus of any of aspects 1 through 2, where the polarized dielectric material includes: a first surface oriented away from the channel material and the charge trapping material, the first surface including a positively charged portion of the polarized dielectric material; and a second surface oriented towards the channel material and the charge trapping material, the second surface including a negatively charged portion of the polarized dielectric material, where the shifted electron distribution of the channel material is based at least in part on the orientation of the second surface of the polarized dielectric material toward the channel material.

Aspect 4: The apparatus of aspect 3, where the polarized dielectric material includes an aluminum nitride film.

Aspect 5: The apparatus of any of aspects 3 through 4, further including: an oxide material lining the first surface of the polarized dielectric material and having a positive charge.

Aspect 6: The apparatus of any of aspects 3 through 5, further including: an oxide material lining the second surface of the polarized dielectric material and having a negative charge.

Aspect 7: The apparatus of any of aspects 1 through 6, where the polarized dielectric material has a fixed polarity.

Aspect 8: The apparatus of any of aspects 1 through 7, where a level of cell-to-cell interference between two or more memory cells of the plurality of memory cells is based at least in part on the electron distribution of the channel material.

Aspect 9: The apparatus of any of aspects 1 through 8, further including: a tunnel oxide material extending away from the substrate and through the alternating stack of materials, the tunnel oxide material associated with the plurality of memory cells and positioned between the charge trapping material and the channel material.

Aspect 10: The apparatus of any of aspects 1 through 9, where the charge trapping material, the channel material, and the polarized dielectric material are orthogonal to one or more materials of the alternating stack of materials.

Aspect 11: The apparatus of any of aspects 1 through 10, where the polarized dielectric material includes a wide band semiconductor having a constant polarization that is thermally stable over a range of temperatures associated with operation of the apparatus.

Aspect 12: The apparatus of any of aspects 1 through 11, where a time period for erasing or programming the plurality of memory cells is based at least in part on the electron distribution of the channel material.

An apparatus is described. The following provides an overview of aspects of the apparatus as described herein:

Aspect 13: An apparatus, including: a plurality of materials including a stack of alternating materials and a charge trapping material, where the charge trapping material extends in a first direction and the stack includes materials that extend in a second direction; a channel material associated with the charge trapping material, the channel material extending in the first direction; and a first material extending in the first direction, the first material including: a positively charged surface oriented away from the channel material; and a negatively charged surface oriented towards the channel material, the negatively charged surface configured to shift an electron distribution of the channel material towards the plurality of materials.

Aspect 14: The apparatus of aspect 13, where the channel material is positioned between the charge trapping material and the first material, and the shifted electron distribution of the channel material is based at least in part on the positioning of the charge trapping material, the channel material, and the first material.

Aspect 15: The apparatus of any of aspects 13 through 14, where the first material includes a polarized dielectric material.

Aspect 16: The apparatus of any of aspects 13 through 15, further including: an oxide material lining the positively charged surface of the first material and having a positive charge.

Aspect 17: The apparatus of any of aspects 13 through 16, further including: an oxide material lining the negatively charged surface of the first material and having a negative charge.

Aspect 18: The apparatus of any of aspects 13 through 17, where the first material has a fixed polarity.

Aspect 19: The apparatus of any of aspects 13 through 18, where the plurality of materials further includes: a tunnel oxide material extending in the first direction, the tunnel oxide material positioned between the charge trapping material and the channel material.

An apparatus is described. The following provides an overview of aspects of the apparatus as described herein:

Aspect 20: An apparatus, including: a charge trapping material associated with a plurality of memory cells and extending in a first direction; a first material extending associated with electron movement for the plurality of memory cells, the first material extending in the first direction; and a second material extending in the first direction, the second material configured to shift an electron distribution of the first material towards the charge trapping material based at least in part on a negatively charged surface of the second material that is oriented towards the first material.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The term "on" or "above" may define one or more materials (e.g., placed, deposited, located) in contact with a first material (e.g., a lower, or previously-deposited, material), or may define one or more materials (e.g., placed, deposited, located) in contact with one or more second materials that may intervene between the one or more materials and the first material (e.g., a lower, or previously-deposited, material). As such, one or more materials described as being "on" or "above" a first material may be in contact with the first material, or may be in contact with one or more intervening second materials.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a substrate;
   an alternating stack of materials positioned on the substrate, the alternating stack of materials comprising conductive materials and dielectric materials;
   a charge trapping material extending away from the substrate and through the alternating stack of materials, the charge trapping material associated with a plurality of memory cells;
   a channel material extending away from the substrate and through the alternating stack of materials, the channel material associated with the plurality of memory cells; and
   a polarized dielectric material extending away from the substrate and through the alternating stack of materials, the polarized dielectric material configured to shift an electron distribution of the channel material towards the charge trapping material.

2. The apparatus of claim 1, wherein:
   the channel material is positioned between the charge trapping material and the polarized dielectric material; and
   the shifted electron distribution of the channel material is based at least in part on the positioning of the charge trapping material, the channel material, and the polarized dielectric material.

3. The apparatus of claim 1, wherein the polarized dielectric material comprises:
   a first surface oriented away from the channel material and the charge trapping material, the first surface comprising a positively charged portion of the polarized dielectric material; and
   a second surface oriented towards the channel material and the charge trapping material, the second surface comprising a negatively charged portion of the polarized dielectric material, wherein the shifted electron distribution of the channel material is based at least in part on the orientation of the second surface of the polarized dielectric material toward the channel material.

4. The apparatus of claim 3, wherein the polarized dielectric material comprises an aluminum nitride film.

5. The apparatus of claim 3, further comprising:
   an oxide material lining the first surface of the polarized dielectric material and having a positive charge.

6. The apparatus of claim 3, further comprising:
   an oxide material lining the second surface of the polarized dielectric material and having a negative charge.

7. The apparatus of claim 1, wherein the polarized dielectric material has a fixed polarity.

8. The apparatus of claim 1, wherein a level of cell-to-cell interference between two or more memory cells of the plurality of memory cells is based at least in part on the electron distribution of the channel material.

9. The apparatus of claim 1, further comprising:
   a tunnel oxide material extending away from the substrate and through the alternating stack of materials, the tunnel oxide material associated with the plurality of memory cells and positioned between the charge trapping material and the channel material.

10. The apparatus of claim 1, wherein the charge trapping material, the channel material, and the polarized dielectric material are orthogonal to one or more materials of the alternating stack of materials.

11. The apparatus of claim 1, wherein the polarized dielectric material comprises a wide band semiconductor having a constant polarization that is thermally stable over a range of temperatures associated with operation of the apparatus.

12. The apparatus of claim 1, wherein a time period for erasing or programming the plurality of memory cells is based at least in part on the electron distribution of the channel material.

* * * * *